US008165320B2

(12) United States Patent
Lee

(10) Patent No.: US 8,165,320 B2
(45) Date of Patent: Apr. 24, 2012

(54) AUDIO/VIDEO DEVICE HAVING A VOLUME CONTROL FUNCTION FOR EXTERNAL AUDIO REPRODUCTION UNIT BY USING VOLUME CONTROL BUTTONS OF A REMOTE CONTROLLER AND VOLUME CONTROL METHOD THEREFOR

(75) Inventor: Jae-Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/652,892

(22) Filed: Jan. 6, 2010

(65) Prior Publication Data

US 2010/0124338 A1 May 20, 2010

Related U.S. Application Data

(63) Continuation of application No. 10/849,137, filed on May 20, 2004, now Pat. No. 7,672,470.

(30) Foreign Application Priority Data

Nov. 21, 2003 (KR) ................................ 2003-82851

(51) Int. Cl.
*H03G 3/00* (2006.01)
*H04R 1/10* (2006.01)
*H02B 1/00* (2006.01)
*H04R 1/02* (2006.01)
*H04R 9/06* (2006.01)

(52) U.S. Cl. .......... 381/104; 381/74; 381/105; 381/107; 381/109; 381/123; 381/333

(58) Field of Classification Search .................. 381/104, 381/105, 123, 85, 333, 332, 306, 74, 107, 381/109; 715/714, 727
See application file for complete search history.

(56) References Cited

U.S. PATENT DOCUMENTS 5,910,991 A 6/1999 Farrar
(Continued)

FOREIGN PATENT DOCUMENTS

EP 1061774 A2 12/2000
(Continued)

OTHER PUBLICATIONS

Machine translation of JP 08-079877,translation done Oct. 8, 2011, Detailed Description from "Searching PAJ" website, http://www19.ipdl.inpit.go.jp/PA1/cgi-bin/PA1INIT?1217524650097.*

*Primary Examiner* — Vivian Chin
*Assistant Examiner* — Douglas Suthers
(74) *Attorney, Agent, or Firm* — Sughrue Mion, PLLC

(57) ABSTRACT

An audio/video (A/V) device having a volume control function for external audio reproduction units by using volume control buttons of a remote controller is provided. The A/V device includes speakers, an audio output port for externally outputting an audio signal, an audio signal processing unit for reproducing and amplifying the audio signal and applying the amplified audio signal to the speakers or the audio output port, a memory unit for storing volume control values, and a control unit for applying to the audio signal processing unit any of the volume control values stored in the memory based on whether the external audio reproduction unit is plugged in the audio output port. The control unit controls the audio signal processing unit to adjust the volume control values for the audio output port by the volume control buttons when the external audio reproduction unit is plugged in the audio output port.

13 Claims, 6 Drawing Sheets

U.S. PATENT DOCUMENTS

| | | | |
|---|---|---|---|
| 6,144,876 | A | 11/2000 | Bouton |
| 6,148,085 | A | 11/2000 | Jung |
| 2002/0039426 | A1 | 4/2002 | Takemoto et al. |

FOREIGN PATENT DOCUMENTS

| | | | |
|---|---|---|---|
| JP | 08-079877 | | 3/1996 |
| JP | 08-330867 | | 12/1996 |
| JP | 1045884 | A | 5/1998 |
| JP | 6113390 | A | 5/1998 |
| JP | 2000358294 | A | 12/2000 |
| JP | 2002010389 | A | 1/2002 |
| JP | 2002151986 | A | 5/2002 |
| JP | 2003-204491 | | 7/2003 |
| KR | 98-57592 | | 11/1999 |
| KR | 2000-0045824 | | 7/2000 |

* cited by examiner

AUDIO/VIDEO DEVICE HAVING A VOLUME CONTROL FUNCTION FOR EXTERNAL AUDIO REPRODUCTION UNIT BY USING VOLUME CONTROL BUTTONS OF A REMOTE CONTROLLER AND VOLUME CONTROL METHOD THEREFOR

CROSS-REFERENCE TO RELATED APPLICATIONS

This is a Continuation Application of application Ser. No. 10/849,137, filed May 20, 2004, which claims the benefit under 35 U.S.C. §119 from Korean patent Application No. 2003-82851, filed on Nov. 21, 2003, the entire content of which is incorporated herein by reference.

BACKGROUND OF THE INVENTION

1. Field of the Invention

The present invention relates to a volume control method for audio/video devices and an audio/video device using the method. More particularly, the present invention relates to a volume control method for audio/video devices and an audio/video device, capable of controlling the volume of an external audio reproduction unit by use of volume control buttons of a remote controller without a separate On-screen display (OSD) menu window when the external audio reproduction unit such as an earphone, a headset, or speakers is plugged in.

2. Description of the Related Art

In general, the audio/video (A/V) device such as a television set, a projection TV, an LCD TV, and a home theater reproduces an audio signal through built-in speakers when receiving and reproducing the broadcast signal, and the A/V device controls its volume by use of a remote controller for controlling the speakers. When a user wants to listen to a broadcast by plugging an external audio reproduction unit such as a headset or an earphone in an A/V device, he or she can not directly control the volume level for the external audio reproduction unit by using the volume control buttons of a remote controller, but controls the volume level for the external audio reproduction unit on an OSD menu window provided on the A/V device.

FIG. 1 illustrates an audio reproduction unit of a conventional A/V device, which conceptually depicts connections of speakers and an external audio reproduction unit.

The audio reproduction unit of an A/V device has an amplification unit 10 for amplifying an input audio signal, a switch 20 for switching an output of the amplification unit 10, and speakers 30. An audio signal output from the amplification unit 10 is reproduced through the speakers 30 or a headset 40. The switch 20 is built in a headphone jack constructed to generally disconnect the amplification unit 10 with the speakers 30 when the headset 40 is plugged in the A/V device. That is, when the male connector of a headset 40 is inserted into the headphone jack, the amplification unit 10 and the speakers 30 are disconnected from each other, and an audio signal output from the amplification unit 10 is applied to the headset 40. When the male connector is not inserted into the headphone jack, the output signal of the amplification unit 10 is applied only to the speakers 30. The audio reproduction unit constructed as above applies an audio signal to the speakers 30 and the headset 40 in the same signal level. In general, the speakers 30 have the impedance of 4Ω~8Ω, whereas the headset 40 has the impedance of 16Ω~32Ω. Accordingly, when the volume level set for the speakers 30 is applied to the headset 40, an audio signal is reproduced by the headset 40 and the speakers 30 in a different volume level. As a result, a viewer is inconvenienced not only in properly controlling the volume level whenever plugging the headset in an A/V device, but also in setting the volume level for the speakers 30 again when releasing the headset 40 from the A/V device.

FIG. 2A is a view illustrating another audio reproduction unit provided in a conventional A/V device.

The audio reproduction unit shown in FIG. 2A partially solves the problem of the audio reproduction unit shown in FIG. 1. That is, the audio reproduction unit solves the problem of separately setting the volume levels of the speakers and the headset, which is characterized in that volume values on speakers 54 and a headset 55 are stored in an electrically erasable and programmable read only memory (EEPROM) 51. The audio reproduction unit enables a processor 52 (receiving information from key input unit 53) to detect the plugging of a headset 55 into an amplification unit 50 and apply a volume value for the headset 55 to the amplification unit 50, so as to enable the amplification unit 50 to output an audio signal in a proper volume level when a viewer plugs or unplugs the headset 55 into or from the output port of the amplification unit 50. The A/V device having the audio reproduction unit stores in the EEPROM 51 the latest volume values, that is, the latest volume values for the speakers 54 and the headset 55 that a viewer sets to the A/V device.

However, even though the volume values for the headset 55 is stored in the EEPROM 51, the viewer loads a separate OSD menu window on a display unit (not shown) of the A/V device, and increases or decreases the volume value set for the headset 55 on the display unit, when the viewer wants to change the volume value.

FIG. 2B is a view illustrating a volume-setting process for the headset 55 of the A/V device of FIG. 2A.

To control the volume level for the headset 55 shown in FIG. 2A, the viewer has the OSD menu window 60 displayed on the display unit, and adjusts the volume level with an input device such as a remote controller (not shown). In the OSD menu window 60, the viewer chooses an Audio menu 61 and a headset adjustment option 62a for adjusting the volume level for a headset, and increases or decreases the volume level of the headset 55 through a volume control menu window 62b displayed on the OSD menu window 60. In controlling the volume level for the headset 55, the viewer experiences inconvenience and not-too-easy operations.

SUMMARY OF THE INVENTION

The present invention has been developed in order to solve the above drawbacks and other problems associated with the conventional arrangement. An aspect of the present invention is to provide an audio/video device and a volume control method facilitating volume controls of an external audio reproduction unit by using volume control buttons of a remote controller.

The foregoing and other aspects and advantages are substantially realized by providing an audio/video (A/V) device including speakers, an audio output port for externally outputting an audio signal, an audio signal processing unit for reproducing and amplifying the audio signal and applying the amplified audio signal to any of the speakers or the audio output port, a memory unit for storing volume control values corresponding to the audio output port and the speakers, and a control unit for applying to the audio signal processing unit any of the volume control values stored in the memory based on whether the external audio reproduction unit is plugged in the audio output port. The control unit controls the audio signal processing unit to increase or decrease the volume control values for the audio output port by the volume control buttons provided on the remote controller when the external audio reproduction unit is plugged in the audio output port.

The A/V device may further include a display unit for reproducing a video signal. The control unit controls the display unit to display a volume control menu window for increasing or decreasing the volume control values when detecting the external audio reproduction unit plugged in the audio output port.

The volume control menu window is displayed on a portion of an image reproduction area of the display unit when the external audio reproduction unit is plugged in the audio output port.

The volume control menu window for the external audio reproduction unit is converted to a volume control menu window for the speakers when the external audio reproduction unit is unplugged from the audio output port.

In an exemplary embodiment of the present invention, the external audio reproduction unit is any of a headset, an earphone, and the speakers.

Furthermore, an aspect of the present invention is to provide a volume control method for an A/V device having speakers for reproducing an audio signal, an audio output port for externally outputting the audio signal, and a display unit for reproducing images, includes steps of detecting whether an external audio reproduction unit is plugged in the audio output port, displaying on the display unit a volume control menu window for controlling volume levels to be output from the audio output port when the external audio reproduction unit is plugged in the audio output port, and increasing or decreasing the volume level for the external audio reproduction unit plugged in the audio output port on the volume control menu window by using volume control buttons of a remote controller for controlling the A/V device.

In displaying the volume control menu window on the display unit, a previously stored volume value for the external audio reproduction unit is displayed on the display unit.

In an exemplary embodiment of the present invention, the previously stored volume value is the latest volume value set for the external audio reproduction unit during operations of the A/V device.

In an exemplary embodiment of the present invention, the step of displaying the volume control menu window on the display unit converts the volume control menu window on the display unit to a volume control menu window for the speakers when the external audio reproduction unit is released from the audio output port.

BRIEF DESCRIPTION OF THE DRAWINGS

The above aspects and features of the present invention will be more apparent by describing certain embodiments of the present invention with reference to the accompanying drawings, in which:

FIG. 5A and FIG. 5B are views illustrating an OSD menu window displayed on a screen depending on whether a headset is plugged in.

DETAILED DESCRIPTION OF THE ILLUSTRATIVE, NON-LIMITING EMBODIMENTS

The present invention will be described in detail with reference to the accompanying drawings.

Figure 3:
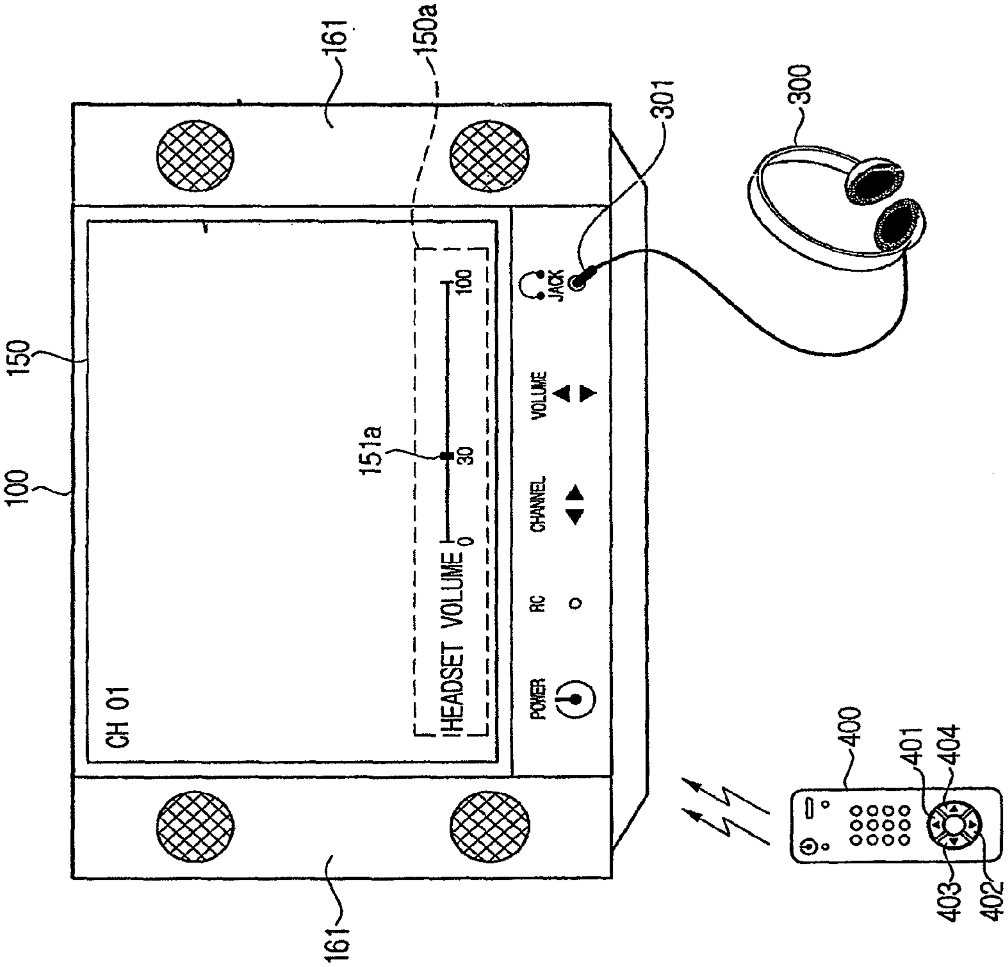
FIG. 3 is a view illustrating a volume control method for an audio/video device according to an embodiment of the present invention.

FIG. 3 illustrates a volume control method for an A/V device according to an embodiment of the present invention.

Figure 1:
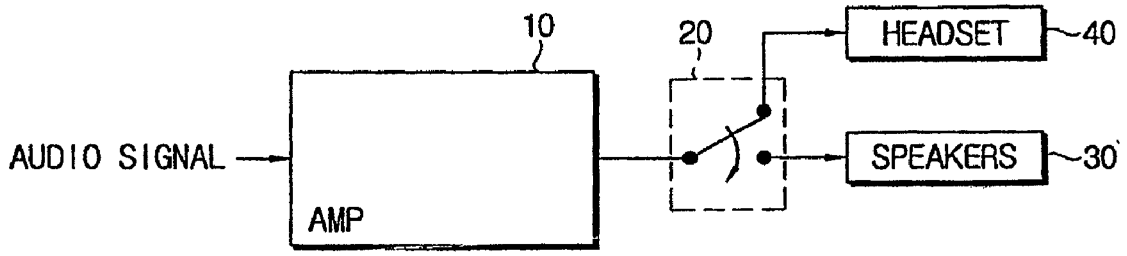
FIG. 1 (PRIOR ART)
FIG. 1 is a view illustrating an audio reproduction unit of a conventional audio/video device.
Figure 2A:
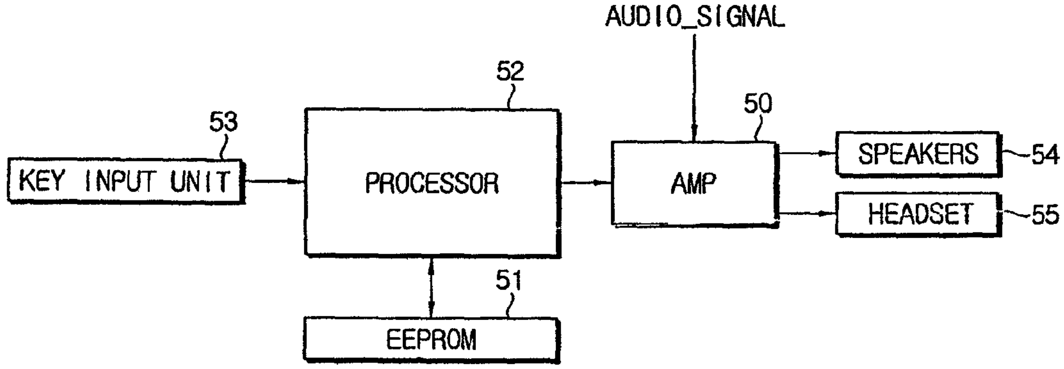
FIG. 2A (PRIOR ART)
FIG. 2A is a block diagram illustrating another audio reproduction unit of the conventional audio/video device.
Figure 2B:
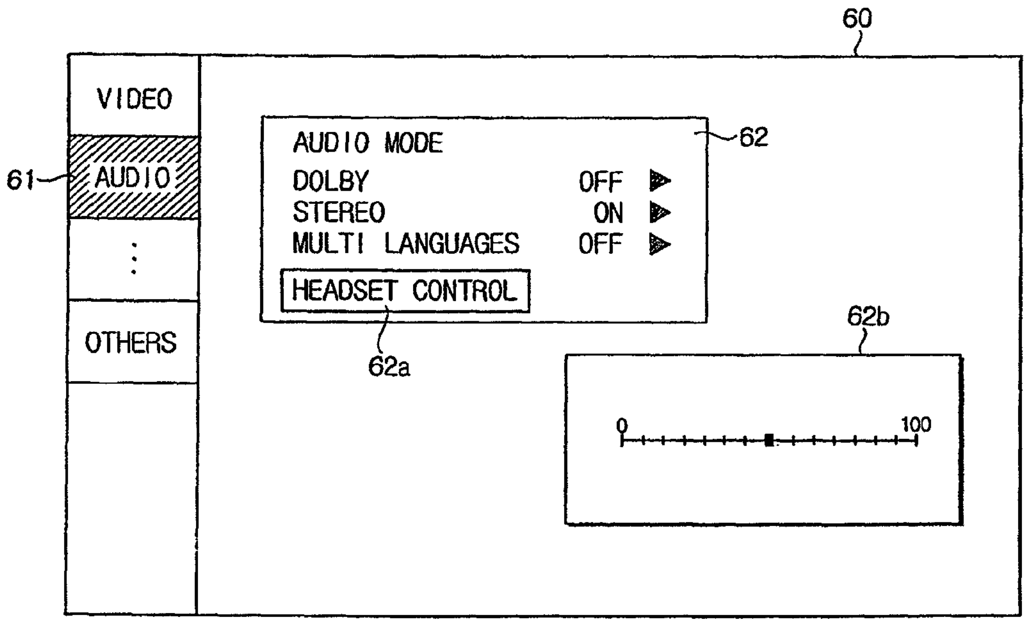
FIG. 2B (PRIOR ART)
FIG. 2B is a view illustrating a volume control process for a headset for the audio/video device of FIG. 2A.

An A/V device 100 controls volume levels and sets channels by using a remote controller 400, and the main body of the A/V device 100 is provided with an audio output port in which an external audio reproduction unit such as a headset 300 is plugged. The main body of the A/V device 100 has a power switch, channel-setting buttons, volume control buttons, a headset jack, a screen 150, and speakers 161. If the headset 300 is not plugged in the headset jack by using a male connector 301, an audio signal is reproduced through the speakers 161 provided on the main body of the A/V device 100. If a viewer plugs the headset 300 in the headset jack, an On-screen display (OSD) menu window 150*a* for controlling the volume level for the headset 300 is displayed on the bottom of the screen, that is, of a display unit 150. If the viewer presses volume control buttons 403 and 404 provided on the remote controller 400, the cursor on the OSD menu window 150*a* moves so that the magnitude of an audio signal applied to the headset 300 increases and decreases. In FIG. 3, the cursor 151*a* indicates that the volume level is set to "30". If the viewer unplugs the headset 300 from the A/V device 100, an OSD menu window (not shown) for controlling the volume level for the speakers 161 is displayed on the bottom of the display unit 150. Thus, the viewer can control the volume level for the speakers 161 by using the volume control buttons 403 and 404 provided on the remote controller 400. Therefore, the viewer does not have to control the volume level for the headset 300 with a complicated OSD as shown in FIG. 2B. The viewer can conveniently control the volume level of the headset 300 by using the remote controller 400 at the same time that the viewer plugs the headset 300 in the headset jack provided on the A/V device 100.

Figure 4:
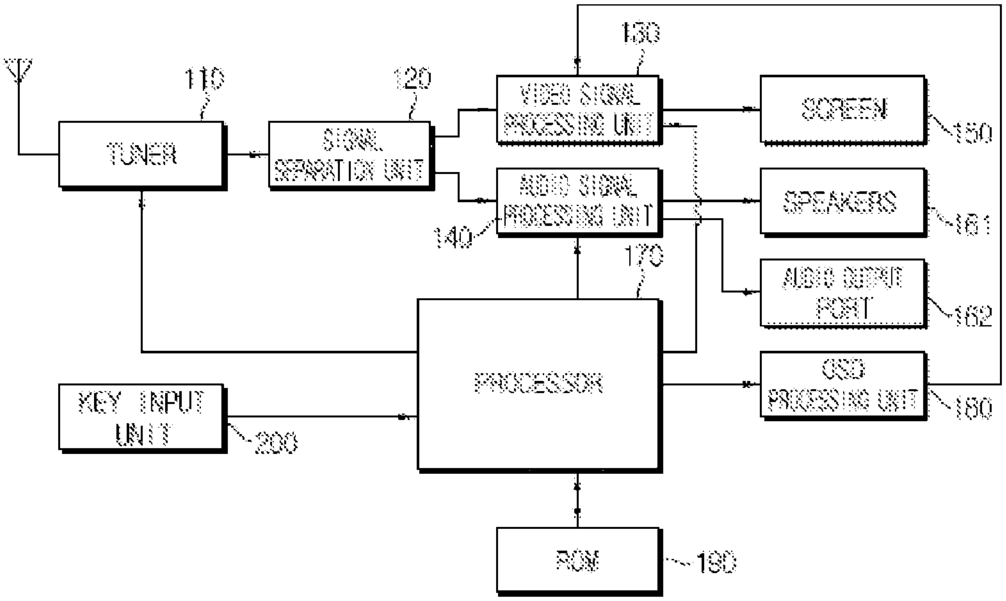
FIG. 4 is a block diagram illustrating the audio/video device of FIG. 3.

FIG. 4 is a block diagram illustrating the A/V device 100 of FIG. 3, which will be described together with FIG. 3 as below.

The A/V device 100 has a tuner 110, a signal separation unit 120, a video signal processing unit 130, an audio signal processing unit 140, a screen 150, speakers 161, an audio output port 162, a processor 170, an OSD processing unit 180, a ROM 190, and a key input unit 200.

The tuner 110 receives broadcast signals, and selects any of the broadcast signals received according to the channel-setting keys 401 and 402 provided on the remote controller 400. The signal separation unit 120 separates a video signal and an audio signal from a broadcast signal selected by the tuner 110. The separated video signal is applied to the video signal processing unit 130, and the audio signal is applied to the audio signal processing unit 140. The video signal processing unit 130 decodes and applies an input video signal to the screen 150, and the audio signal processing unit 140 amplifies and outputs the input audio signal to the speakers 161. The output terminal of the audio signal processing unit 140 is connected together with the speakers 161 and the audio output port 162. If a headset, an earphone, or external speakers (not shown) are plugged in the audio output port 162, any audio signal is not applied to the speakers 161. That is, the audio signal processing unit 140 applies the audio signal to any of the speakers 161 and the audio output port 162.

The processor 170 controls the overall functions of the A/V device 100, and controls the video signal processing unit 130, the audio signal processing unit 140, and the tuner 110, by using a control signal. For example, when the viewer sends a control signal for channel changes to the key input unit 200 by using the remote controller 400, the key input unit 200 receives and applies the control signal to the processor 170, and the processor 170 responds to the control signal and controls to change channels broadcasted from tuner 110. If the viewer increments or decrements a contrast value or a luminance value for an image displayed on the screen 150, the processor 170 controls the video signal processing unit 130, using the control signal sent by the remote controller 400, so as to change the contrast value or the luminance value for the image output on the screen 150. Furthermore, when an external audio reproduction unit such as a headset 300 is plugged in the audio output port 162, the processor 170 loads a volume setting value for the headset 300 that is built in the ROM 190 in response to the plugging of the headset 300, and controls the audio signal processing unit 140 based on the volume-setting value to change the level of an audio signal output from the audio signal processing unit 140 to the audio output port 162. Simultaneously, the processor 170 controls the OSD processing unit 180 to display on the screen 150 an OSD menu window such as the window 150*a* enabling the viewer to see whether the headset 300 is plugged in. The OSD menu window such as the window 150*a* displayed on the screen 150 by the OSD processing unit 180 enables the viewer to control the volume to a certain level with the volume control buttons 403 and 404 provided on the remote controller 400.

The ROM 190 stores the latest volume values, that is, the respective volume values for the speakers 161 and the headset 300 that the viewer sets to the A/V device 100. The stored values are displayed on the OSD menu window such as the window 150*a*, and the displayed values can be immediately changed through the volume control buttons 403 and 404 provided on the remote controller 400.

Figure 5A:
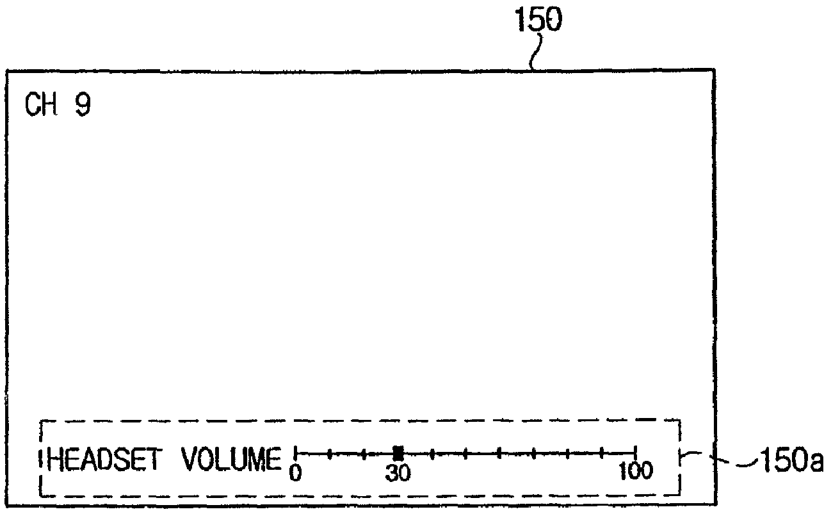
Figure 5B:
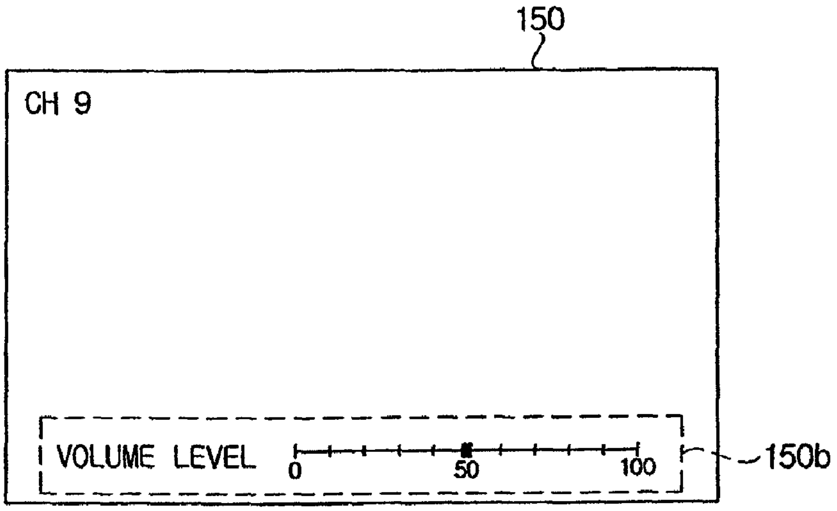

FIG. 5A and FIG. 5B illustrate OSD menu windows displayed on the screen 150 depending on whether the headset 300 is plugged in.

FIG. 5A illustrates an OSD menu window 150*a* when the headset 300 is plugged in the A/V device 100. The OSD menu window 150*a* for controlling the volume level for a headset 300 is displayed on the bottom of the screen 150 at the same time that the headset 300 is plugged in. The viewer presses the volume control buttons 403 and 404 provided on the remote controller 400, looking at the displayed OSD menu window 150*a*, to control the volume level for an external audio reproduction unit such as the headset 300.

Next, FIG. 5B illustrates an OSD menu window 150*b* displayed on the screen 150 when the headset 300 is unplugged from the A/V device 100. The OSD menu window 150*b* for controlling the volume level for the speakers 161 provided in the A/V device 100 is displayed on the bottom of the screen 150. If the viewer presses the volume control buttons 403 and 404 provided on the remote controller 400, the volume level for the speakers 161 is controlled and the controlled volume value is stored in the ROM 190. Hence, the viewer can easily control the level of an audio signal to be reproduced through the speakers 161 or the headset 300 by pressing the volume control buttons 403 and 404 provided on the remote controller 400 without having to pay attention to whether the headset 300 is plugged in.

Figure 6:
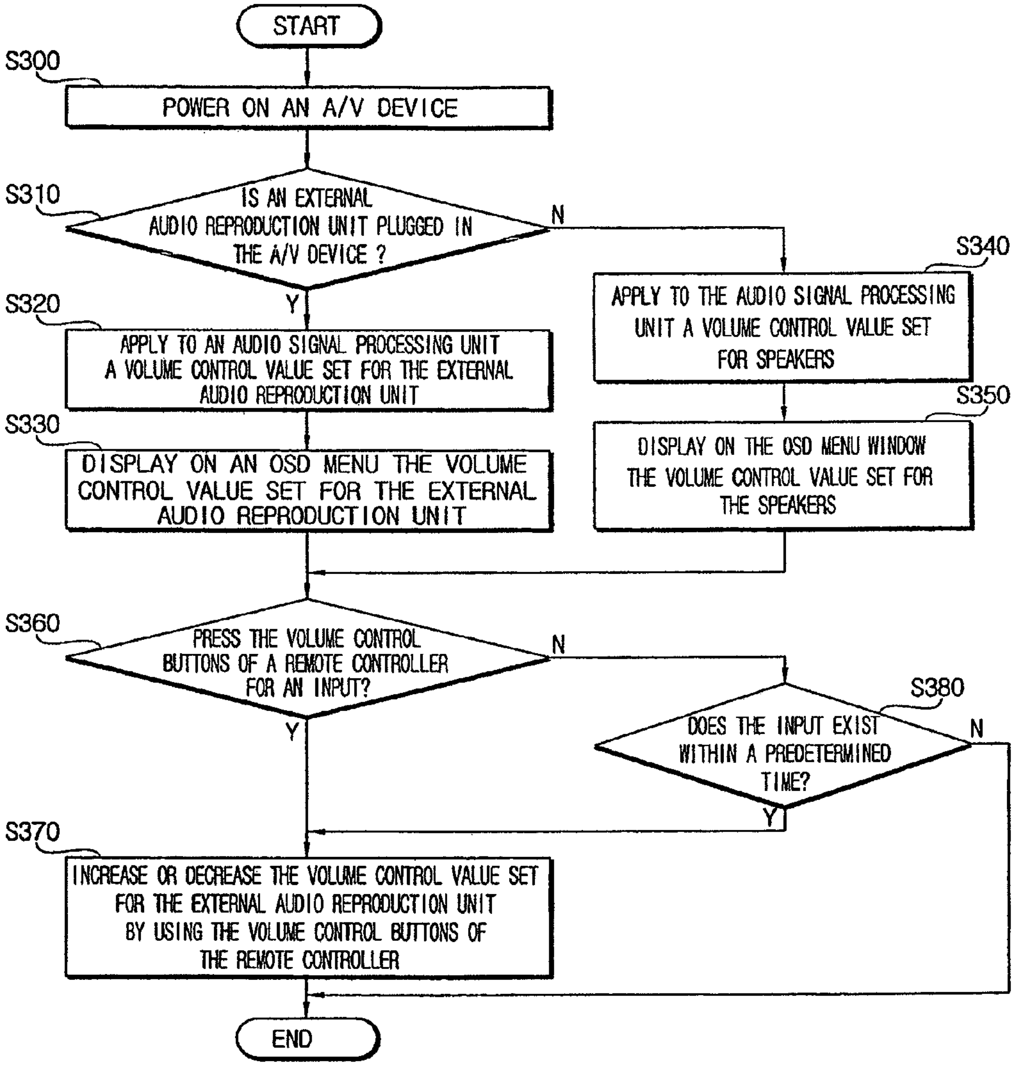
FIG. 6 is a flow chart for controlling the volume level for an external audio reproduction unit by using volume control buttons of a remote controller according to an embodiment of the present invention.

FIG. 6 is a flow chart for explaining a volume control method for external audio reproduction units such as a headset according to an embodiment of the present invention.

If the A/V device 100 is powered on at step S300, the processor 170 determines whether an external audio reproduction unit such as a headset or an earphone is plugged in the A/V device 100 at step S310. The audio output port 162 connected to the output terminal of the audio signal processing unit 140 may determine whether the external audio reproduction unit is plugged in.

For example, when the headset 300 is plugged in the audio output port 162 by using the male connector 301, a sensor (not shown) detects whether the headset 300 is plugged in. The sensor is mounted inside the audio output port 162 to detect the plugging of a headset 300. When the headset 300 is plugged in the audio output port 162, the processor 170 can detect the plug-in of the headset 300 through changes of the impedance or currents of the audio output port 162.

If an external audio reproduction unit such as the headset 300 is plugged in the A/V device 100, the processor 170 loads a volume control value corresponding to the headset 300 out of the volume control values stored in the ROM 190, and applies the volume control value to the audio signal processing unit 140 to decrease or increase the amplification degree of the audio signal processing unit 140 at step S320.

The processor 170 controls the OSD processing unit 180 to apply an OSD menu window from the OSD processing unit 180 to the video signal processing unit 130 so that the viewer can increment or decrement the volume level for the headset 300 at step S330. If any external audio reproduction unit is not plugged in the audio output port 162, the processor 170 loads a volume control value corresponding to the speakers 161 out of the volume control values stored in the ROM 190, and applies the loaded volume control value to the audio signal processing unit 140 so as to increase or decrease the amplification degree of the audio signal processing unit 140 at step S340.

Next, the processor 170 controls the OSD processing unit 180 to apply the OSD menu window from the OSD processing unit 180 to the video signal processing unit 130 so that the viewer can increase or decrease the volume level of the speakers 161 at step S350.

If the OSD menu 150*a* or 150*b* is loaded on the screen 150 to enable a user to control the volume level for the headset 300 or the speakers 161, the processor 170 stands by for the inputs of the volume control buttons of the remote controller 400 which are used for volume controls at step S360. Pressing the volume control buttons 403 and 404 provided on the remote controller 400, the viewer can move the cursor 151*a* on the OSD menu window 150*a* or 150*b* back and forth to change the volume control value stored in the ROM 190. Simultaneously, the amplification degree of the audio signal processing unit 140 is changed according to the changed volume control values at step S370.

If no input occurs by the volume control buttons of the remote controller 400 when the OSD menu window 150*a* or 150*b* is displayed on the screen 150, the processor 170 stands by for a predetermined time such as 5 seconds, and checks if the inputs are applied from the volume control buttons 403 and 404 within a predetermined time such as five seconds at step S380.

If there exists an input of a control signal from the volume control buttons 403 and 404 within the predetermined time as a result of the check, the processor 170 changes the volume control values of the ROM 190 set for the speakers 161 and the headset 300 according to the inputted control signal corresponding to the volume control buttons 403 and 404. Otherwise, the processor 170 turns off the OSD menu window 150*a* or 150*b* which is for volume controls. Accordingly, the viewer does not have to check whether the headset 300 is plugged in the A/V device 100 in order to separately control volumes.

As described above, according to the present invention, with respect to plugging an external audio reproduction unit such as a headset, an earphone, and external speakers in an A/V device, the viewer does not have to separately control volume levels for the plugged external audio reproduction unit. When the external audio reproduction unit is plugged in the A/V device, the present invention displays a menu window for controlling volume levels for the external audio reproduction unit so that the viewer can conveniently control the volume levels on the displayed menu window with the volume control buttons provided on the remote controller.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. An audio/video (A/V) device having a volume control function for an external audio reproduction unit, comprising:
- a speaker;
- a display unit for reproducing a video signal;
- an audio output port for externally outputting an audio signal;
- an audio signal processing unit for reproducing and amplifying the audio signal and applying the amplified audio signal to any of the speaker or the audio output port;
- a memory unit for storing volume control values corresponding to the audio output port and the speaker; and
- a control unit for applying to the audio signal processing unit any of the volume control values stored in the memory based on whether the external audio reproduction unit is plugged into the audio output port,
- wherein the control unit controls the audio signal processing unit to increase or decrease one of the volume control values corresponding to the audio output port stored in the memory unit, and
- wherein the control unit controls the display unit to display a volume control menu window for showing a level of one of the volume control values upon a detection of the external audio reproduction unit being plugged into the audio output port.

2. The A/V device as claimed in claim 1, wherein the volume control menu window is displayed on a portion of an image reproduction area of the display unit upon the detection of the external audio reproduction unit being plugged into the audio output port.

3. The A/V device as claimed in claim 1, wherein the volume control menu window for the external audio reproduction unit is changed to a volume control menu window for the speaker upon a detection of the external audio reproduction unit being unplugged from the audio output port.

4. The A/V device as claimed in claim 1, wherein the external audio reproduction unit is any of a headset, an earphone, and an external speaker.

5. The A/V device as claimed in claim 1, wherein the control unit controls so that a sound output from the speaker is switched to the audio output port upon the detection of the external audio reproduction unit being plugged into the audio output port.

6. The A/V device as claimed in claim 1, wherein the memory unit comprises a first memory unit for storing a volume control value while an external audio reproduction unit is plugged into the audio output port and a second memory unit for storing a volume control value while the external audio reproduction unit is unplugged from the audio output port.

7. The A/V device as claimed in claim 6, wherein the control unit detects whether the external audio reproduction unit is plugged into the audio output port,
- while the external audio reproduction unit is plugged into the audio output port, the control unit controls the first memory unit to store a first changed volume control value when the one of the volume control values is changed, and while the external audio reproduction unit is unplugged from the audio output port, the control unit controls the second memory unit to store a second changed volume control value when another of the volume control values is changed.

8. A volume control method for an A/V device having a a speaker for reproducing an audio signal, an audio output port for externally outputting the audio signal, and a display unit for reproducing images, the method comprising:
- receiving a volume control signal;
- detecting whether an external audio reproduction unit is plugged into the audio output port;
- displaying on the display unit a volume control menu window for showing a volume level to be output from the audio output port upon a detection of the external audio reproduction unit being plugged into the audio output port;
- applying at least one control value stored in a memory for the volume level based on whether the external audio reproduction unit is plugged into the audio output port, and
- increasing or decreasing the volume level provided in the volume control menu window based on the at least one control value corresponding to the external audio reproduction unit plugged into the audio output port,
- wherein the volume level corresponds to the signal level of the audio signal output to the audio output port.

9. The method as claimed in claim 8, wherein the step of displaying the volume control menu window on the display unit displays a previously stored volume value for the external audio reproduction unit on the display unit.

10. The method as claimed in claim 9, wherein the previously stored volume value is the latest volume value set for the external audio reproduction unit during operations of the A/V device.

11. The method as claimed in claim 8, further comprising changing the volume control menu window displayed on the display unit to a volume control menu window for the speaker upon a detection of the external audio reproduction unit being unplugged from the audio output port.

12. The method as claimed in claim 8, further comprising:
- switching a sound output from the speaker to the audio output port upon the detection of the external audio reproduction unit being plugged into the audio output port.

13. An audio/video (A/V) device having a volume control function for an external audio reproduction unit, comprising:
- a speaker;
- an audio output port for externally outputting an audio signal;
- an audio signal processing unit for reproducing and amplifying the audio signal and applying the amplified audio signal to any of the speaker or the audio output port;
- a memory unit for storing volume control values corresponding to the audio output port and the speaker; and
- a control unit for applying to the audio signal processing unit any of the volume control values stored in the memory based on whether the external audio reproduction unit is plugged into the audio output port, wherein the control unit controls the audio signal processing unit to increase or decrease one of the volume control values corresponding to the audio output port stored in the memory unit, upon a detection of the external audio reproduction unit being plugged into the audio output port, and upon the detection of the external audio reproduction unit being plugged into the audio output port, the control unit controls an audio signal processing unit to load the one of the volume control values corresponding to the audio output port and controls a display unit to display an On Screen Display (OSD) menu corresponding to the audio output port.

* * * * *